United States Patent
Yang et al.

(10) Patent No.: US 10,560,647 B2
(45) Date of Patent: Feb. 11, 2020

(54) DRIVER CIRCUIT, DRIVING METHOD, ACTIVE PIXEL SENSOR, IMAGE SENSOR, AND ELECTRONIC DEVICE

(71) Applicant: BOE TECHNOLOGY GROUP CO., LTD., Beijing (CN)

(72) Inventors: Shengji Yang, Beijing (CN); Xue Dong, Beijing (CN); Jing Lv, Beijing (CN); Xiaochuan Chen, Beijing (CN); Lei Wang, Beijing (CN); Dongni Liu, Beijing (CN); Pengcheng Lu, Beijing (CN); Jie Fu, Beijing (CN); Li Xiao, Beijing (CN); Han Yue, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/780,747

(22) PCT Filed: Nov. 1, 2017

(86) PCT No.: PCT/CN2017/108931
§ 371 (c)(1),
(2) Date: Jun. 1, 2018

(87) PCT Pub. No.: WO2018/082563
PCT Pub. Date: May 11, 2018

(65) Prior Publication Data
US 2018/0359435 A1    Dec. 13, 2018

(30) Foreign Application Priority Data
Nov. 1, 2016  (CN) .......................... 2016 1 0937403

(51) Int. Cl.
*H04N 5/357*    (2011.01)
*H01L 27/146*    (2006.01)
(Continued)

(52) U.S. Cl.
CPC ....... *H04N 5/357* (2013.01); *H01L 27/14643* (2013.01); *H04N 5/374* (2013.01)

(58) Field of Classification Search
CPC .............. H04N 5/357; H01L 27/14601; H01L 27/0207
See application file for complete search history.

(56) References Cited

U.S. PATENT DOCUMENTS 9,432,602 B2 *  8/2016  Takatsuka ............ H04N 5/3698
9,942,502 B2 *  4/2018  Borremans ............ H04N 5/355
(Continued)

FOREIGN PATENT DOCUMENTS

CN    102930824 A    2/2013
CN    103595930 A    2/2014
(Continued)

OTHER PUBLICATIONS

International Search Report of PCT/CN2017/108931 in Chinese, dated Feb. 2, 2018 with English translation.
(Continued)

*Primary Examiner* — Ahmed A Berhan
(74) *Attorney, Agent, or Firm* — Collard & Roe, P.C.

(57) ABSTRACT

A driving circuit and a driving method, an active pixel sensor, an image sensor, and an electronic device. The driving circuit includes: a reset circuit, a photoelectric sensing circuit, a signal forming circuit, a signal conversion circuit, and a signal output circuit. The reset circuit resets the photoelectric sensing circuit and the signal forming circuit; the photoelectric sensing circuit performs photoelectric conversion on incident light irradiation to form a photoelectric voltage signal; the signal forming circuit transmits the
(Continued)

photoelectric voltage signal to the signal conversion circuit, and transmits a compensated photoelectric voltage signal to the signal conversion circuit; the signal output circuit transmits a second voltage to the signal conversion circuit and the signal forming circuit and outputs a photoelectric current signal; the signal conversion circuit forms the compensated photoelectric voltage signal and outputs the photoelectric current signal to signal output circuit.

18 Claims, 7 Drawing Sheets

(51) Int. Cl.
*H04N 5/3745* (2011.01)
*H01L 27/02* (2006.01)
*H04N 5/374* (2011.01)

(56) References Cited

U.S. PATENT DOCUMENTS

2006/0249659 A1   11/2006   Takano et al.
2014/0049675 A1   2/2014   Takatsuka et al.

FOREIGN PATENT DOCUMENTS

| CN | 105789202 A | 7/2016 |
| CN | 105933623 A | 9/2016 |
| CN | 106340514 A | 1/2017 |

OTHER PUBLICATIONS

Notice of Transmittal of the International Search Report of PCT/CN2017/108931 in Chinese, dated Feb. 2, 2018.
Written Opinion of the International Searching Authority of PCT/CN2017/108931 in Chinese, dated Feb. 2, 2018 with English translation.

* cited by examiner

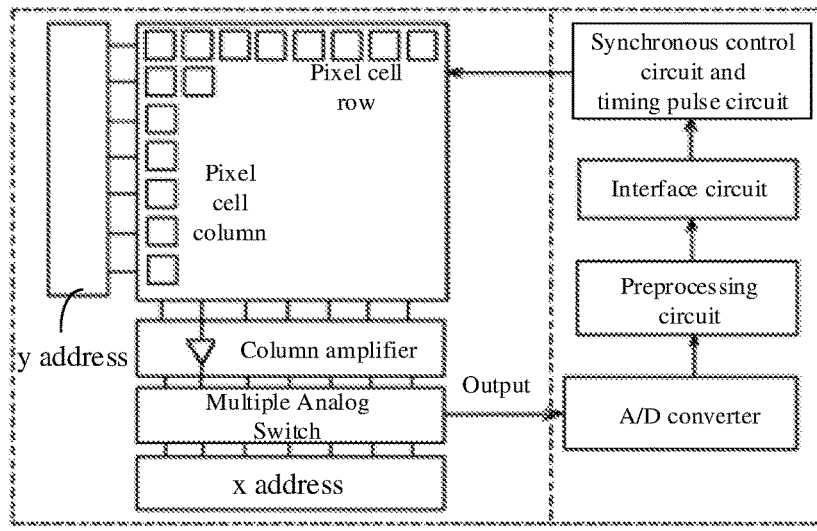

FIG. 10

| In the reset stage, the reset signal terminal outputs the reset signal, and the first voltage of the first voltage terminal is transmitted to the signal forming circuit and the photoelectric sensing circuit under the control of the reset signal | ← 201 |

↓

| In the optical sensing accumulation stage, the photoelectric sensing circuit performs photoelectric conversion under the incident light irradiation to form the photoelectric voltage signal | ← 202 |

↓

| In the discharging stage, the signal forming circuit transmits the photoelectric voltage signal to the signal conversion circuit, and the signal conversion circuit converts the photoelectric voltage signal into the compensated photoelectric voltage signal | ← 203 |

↓

| In the signal acquisition stage, the signal output circuit outputs the second voltage to the signal conversion circuit, the signal conversion circuit outputs the photoelectric current signal to the signal output circuit according to the compensated photoelectric voltage signal | ← 204 |

FIG. 11

DRIVER CIRCUIT, DRIVING METHOD, ACTIVE PIXEL SENSOR, IMAGE SENSOR, AND ELECTRONIC DEVICE

CROSS REFERENCE TO RELATED APPLICATIONS

This application is the National Stage of PCT/CN2017/108931filed on Nov. 1, 2017, which claims priority under 35 U.S.C. § 119 of Chinese Application No. 201610937403.8 filed on Nov. 1, 2016, the disclosure of which is incorporated by reference.

TECHNICAL FIELD

Embodiments of the present disclosure relates to a driving circuit and a driving method, an active pixel sensor, an image sensor and an electronic device.

BACKGROUND

A camera has the function of taking video or still images. The image sensor of the camera comprises an active pixel sensor, and the image sensor senses light through the active pixel sensor when the camera captures an image. The active pixel sensor converts the sensed light into photoelectric currents, and the image sensor converts the photoelectric currents into pixel values of pixels and stores them in an image file to form an image document.

SUMMARY

At least one embodiment of the present disclosure provides a driving circuit for an active pixel sensor, comprising a reset circuit, a photoelectric sensing circuit, a signal forming circuit, a signal conversion circuit, and a signal output circuit. The reset circuit is connected to the photoelectric sensing circuit, the signal forming circuit, and the signal conversion circuit, and is configured to transmit a first voltage, under control of a reset signal, to the photoelectric sensing circuit and the signal forming circuit so as to reset the photoelectric sensing circuit and the signal forming circuit; the photoelectric sensing circuit is connected to the signal forming circuit, and is configured to perform photoelectric conversion on incident light irradiation under control of a first control signal so as to form a photoelectric voltage signal; the signal forming circuit is further connected to the signal conversion circuit, and is configured to transmit the photoelectric voltage signal to the signal conversion circuit under control of a second control signal, and transmit a compensated photoelectric voltage signal to the signal conversion circuit; the signal output circuit is connected to the signal conversion circuit and the signal forming circuit, and is configured to transmit a second voltage, under control of a third control signal, to the signal conversion circuit and the signal forming circuit, and output a photoelectric current signal; and the signal conversion circuit is configured to form the compensated photoelectric voltage signal according to the photoelectric voltage signal, and output the photoelectric current signal to the signal output circuit according to the compensated photoelectric voltage signal.

For example, in the driving circuit provided by at least one embodiment of the present disclosure, the reset circuit is further connected to a first voltage terminal and a reset signal terminal to receive the reset signal and the first voltage; the photoelectric sensing circuit is further connected to a ground terminal and a first control signal terminal to connect to the ground and receive the first control signal; the signal forming circuit is also connected to a second control signal terminal to receive the second control signal; the signal output circuit is also connected to a second voltage terminal and a third control signal terminal to receive the second voltage and the third control signal.

For example, in the driving circuit provided by at least one embodiment of the present disclosure, the signal forming circuit comprises a second capacitor, a fourth transistor, and a fifth transistor. A first electrode of the fourth transistor is connected to a first terminal of a first capacitor, a second electrode of the fourth transistor is connected to the signal conversion circuit, and a gate electrode of the fourth transistor receives the second control signal; a first electrode of the fifth transistor is connected to the signal conversion circuit, a second electrode of the fifth transistor is connected to a first terminal of the second capacitor, and a gate electrode of the fifth transistor receives the second control signal; and a second terminal of the second capacitor receives the second voltage.

For example, in the driving circuit provided by at least one embodiment of the present disclosure, the reset circuit comprises a first transistor and a second transistor. A gate electrode of the first transistor receives the reset signal, a first electrode of the first transistor receives the first voltage, and a second electrode of the first transistor is connected to the photoelectric sensing circuit; and a gate electrode of the second transistor receives the reset signal, a first electrode of the second transistor receives the first voltage, and a second electrode of the second transistor is connected to the signal forming circuit and the signal conversion circuit.

For example, in the driving circuit provided by at least one embodiment of the present disclosure, the photoelectric sensing circuit comprises a photodiode, a third transistor and a first capacitor. An anode of the photodiode is grounded, and a cathode of the photodiode is connected to a first electrode of the third transistor; a gate electrode of the third transistor receives the first control signal, a second electrode of the third transistor is connected to a first terminal of the first capacitor, the second electrode of the first transistor, and the signal forming circuit, and a second terminal of the first capacitor is grounded.

For example, in the driving circuit provided by at least one embodiment of the present disclosure, the signal conversion circuit comprises a driving transistor. A gate electrode of the driving transistor is connected to the first terminal of the second capacitor, the second electrode of the fifth transistor, and the second electrode of the second transistor; a source electrode of the driving transistor is connected to the signal output circuit and the first electrode of the fifth transistor; and a drain electrode of the driving transistor is connected to the signal output circuit and the second electrode of the fourth transistor.

For example, in the driving circuit provided by at least one embodiment of the present disclosure, the signal output circuit comprises a sixth transistor and a seventh transistor. A gate electrode of the sixth transistor receives the third control signal, a first electrode of the sixth transistor receives the second voltage, and a second electrode of the sixth transistor is connected to the source electrode of the driving transistor; and a gate electrode of the seventh transistor receives the third control signal, a first electrode of the seventh transistor is connected to the drain electrode of the driving transistor, and a second electrode of the seventh transistor is connected to an output of the signal conversion circuit.

For example, in the driving circuit provided by at least one embodiment of the present disclosure, the reset circuit, the photoelectric sensing circuit, the signal forming circuit, the signal conversion circuit, and the signal output circuit are all formed by P-type transistors.

At least one embodiment of the present disclosure further provides an active pixel sensor, and the active pixel sensor comprises any of the above-described driving circuits.

At least one embodiment of the present disclosure further provides an image sensor, comprising a plurality of pixel units arranged in an array, and at least one pixel unit comprising any of the above-described active pixel sensor.

At least one embodiment of the present disclosure further provides an electronic device, comprising any of the above-described image sensor At least one embodiment of the present disclosure further provides a driving method for a driving circuit of an active pixel sensor, comprising a reset stage, an optical sensing accumulation stage, a discharging stage, and a signal acquisition stage. In the reset stage, the reset circuit transmits the first voltage to the signal forming circuit and the photoelectric sensing circuit to reset the photoelectric sensing circuit and the signal forming circuit; in the optical sensing accumulation stage, the photoelectric sensing circuit performs photoelectric conversion on the incident light irradiation to form the photoelectric voltage signal; in the discharging stage, the signal forming circuit transmits the photoelectric voltage signal to the signal conversion circuit, and the signal conversion circuit converts the photoelectric voltage signal into the compensated photoelectric voltage signal; in the signal acquisition stage, the signal output circuit outputs the second voltage to the signal conversion circuit, and the signal conversion circuit outputs the photoelectric current signal to the signal output circuit according to the compensated photoelectric voltage signal.

For example, in the driving method provided by at least one embodiment of the present disclosure, in the reset stage, the reset signal is provided, and the first voltage of the first voltage terminal is transmitted, under control of the reset signal, to the signal forming circuit and the photoelectric sensing circuit so as to reset the photoelectric sensing circuit and the signal forming circuit; in the optical sensing accumulation stage, the first control signal is provided, and the photoelectric sensing circuit performs photoelectric conversion under the incident light irradiation and under control of the first control signal to form the photoelectric voltage signal; in the discharging stage, the second control signal is provided, and the signal forming circuit transmits the photoelectric voltage signal to the signal conversion circuit under control of the second control signal, and the signal conversion circuit converts the photoelectric voltage signal into the compensated photoelectric voltage signal; and in the signal acquisition stage, the third control signal is provided, and the signal output circuit outputs the second voltage to the signal conversion circuit under control of the third control signal, and the signal conversion circuit outputs the photoelectric current signal to the signal output circuit according to the compensated photoelectric voltage signal.

For example, in the driving method provided by at least one embodiment of the present disclosure, operation that the signal forming circuit transmits the photoelectric voltage signal to the signal conversion circuit under control of the second control signal, and the signal conversion circuit converts the photoelectric voltage signal into the compensated photoelectric voltage signal, comprises: a fourth transistor and a fifth transistor are turned on under control of the second control signal; the photoelectric voltage signal of a first capacitor is transmitted to a drain electrode of a driving transistor through the fourth transistor, and transmitted from a source electrode of the driving transistor to form a gate voltage signal; and the gate voltage signal is transmitted to a second capacitor through the fifth transistor.

For example, in the driving method provided by at least one embodiment of the present disclosure, operation that the first voltage of the first voltage terminal is transmitted, under control of the reset signal, to the signal forming circuit and the photoelectric sensing circuit so as to reset the photoelectric sensing circuit and the signal forming circuit, comprises: a first transistor and a second transistor are turned on, the first voltage is transmitted to the first capacitor through the first transistor, and is transmitted to the second capacitor through the second transistor under control of the reset signal.

For example, in the driving method provided by at least one embodiment of the present disclosure, operation that the photoelectric sensing circuit performs photoelectric conversion to form the photoelectric voltage signal under the incident light irradiation and under control of the first control signal, comprises: a third transistor turns on a photodiode and the first capacitor under control of the first control signal; and the photodiode turns on the first capacitor and the ground terminal under the incident light irradiation, and the first capacitor discharges to the ground terminal, and forms a photoelectric voltage signal after discharging.

For example, in the driving method provided by at least one embodiment of the present disclosure, operation that the signal output circuit outputs the second voltage to the signal conversion circuit under control of the third control signal, and the signal conversion circuit outputs the photoelectric current signal to the signal output circuit according to the compensated photoelectric voltage signal, comprises: a sixth transistor and a seventh transistor are turned on under control of the third control signal; the second voltage is transmitted to the source electrode of the driving transistor through the sixth transistor, and the gate voltage signal of the second capacitor is transmitted to the gate electrode of the driving transistor; and the drain electrode of the driving transistor outputs the photoelectric current signal, and the photoelectric current signal is output through the seventh transistor.

BRIEF DESCRIPTION OF THE DRAWINGS

In order to clearly illustrate the technical solution of the embodiments of the present disclosure, the embodiments or the drawings of the related technical description will be briefly described in the following, it is obvious that the described drawings are only related to some embodiments of the present disclosure and thus are not limitative of the present disclosure.

FIG. 10 is a schematic diagram of an active pixel sensor provided by an embodiment of the present disclosure; and FIG. 11 is a flowchart of a driving method for an active pixel sensor provided by an embodiment of the present disclosure.

DETAILED DESCRIPTION

Figure 1:
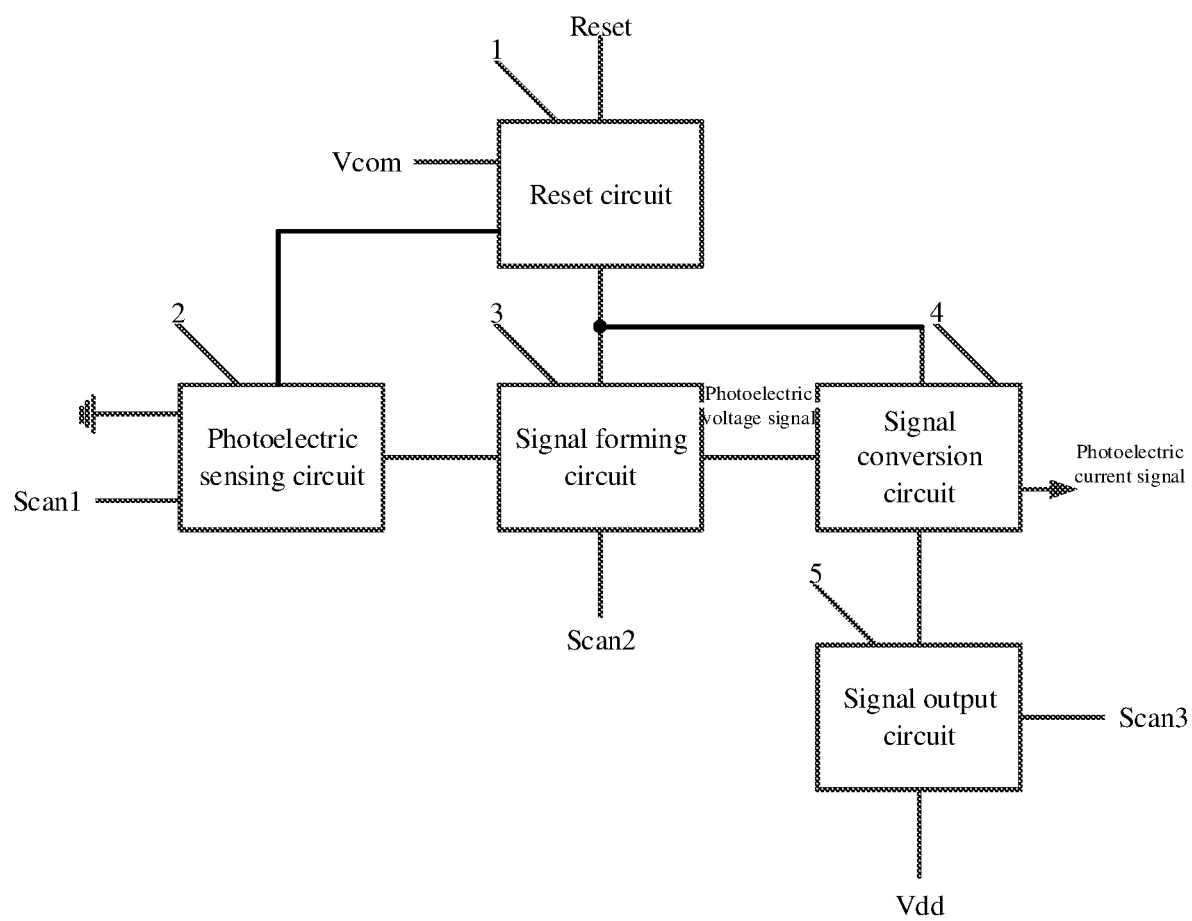
FIG. 1 is a block diagram of a driving circuit for an active pixel sensor provided by an embodiment of the present disclosure.

In order to make objects, technical details and advantages of the embodiments of the invention apparent, the technical solutions of the embodiments will be described in a clearly and fully understandable way in connection with the drawings related to the embodiments of the invention. Apparently, the described embodiments are just a part but not all of the embodiments of the invention. Based on the described embodiments herein, those skilled in the art can obtain other embodiment(s), without any inventive work, which should be within the scope of the invention.

Unless otherwise defined, all the technical and scientific terms used herein have the same meanings as commonly understood by one of ordinary skill in the art to which the present invention belongs. The terms "first," "second," etc., which are used in the description and the claims of the present application for invention, are not intended to indicate any sequence, amount or importance, but distinguish various components. Also, the terms such as "a," "an," etc., are not intended to limit the amount, but indicate the existence of at least one. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly. "On," "under," "right," "left" and the like are only used to indicate relative position relationship, and when the position of the object which is described is changed, the relative position relationship may be changed accordingly.

An active pixel sensor may comprise components such as a photodiode and a source follower, and an anode of the photodiode may be connected to a first voltage terminal, and a cathode of the photodiode may be connected to a gate electrode of the source follower; and a source electrode of the source follower is connected to a second voltage terminal, a drain electrode of the source follower is connected to the bus of the camera, and the second voltage terminal outputs a constant voltage Vdd to the source electrode of the source follower. The photodiode can perform photoelectric conversion when the photodiode is under incident light irradiation, thereby pulling down the gate voltage Vrst of the gate electrode of the source follower, so that the source follower is turned on, and the photoelectric current $I=K(Vdd-Vrst-Vth)^2$ is generated at the drain electrode of the source follower at this time, and Vth is the voltage drop between the gate electrode and the source electrode. With the different intensity of illumination of the incident light, the photodiode generates different gate voltages Vrst at the gate electrode of the source follower, thereby causing the drain electrode of the source follower to produce different photoelectric currents. The bus of the camera can get different photoelectric currents, so that the camera generates different pixel values according to different photoelectric currents. The voltage drops Vth between the gate electrodes and the source electrodes of different source followers are different, so under the same illumination, the photoelectric currents generated by the active pixel sensor may be different, so that the camera generates different pixel values according to the photoelectric currents, and the captured image is distorted.

Embodiments of the present disclosure provide a driving circuit and a driving method thereof, an active pixel sensor and an electronic device. The driving circuit for the active pixel sensor comprises a reset circuit, a photoelectric sensing circuit, a signal forming circuit, a signal conversion circuit, and a signal output circuit. The reset circuit is connected to the photoelectric sensing circuit, the signal forming circuit, and the signal conversion circuit, and is configured to transmit a first voltage, under the control of a reset signal, to the photoelectric sensing circuit and the signal forming circuit so as to reset the photoelectric sensing circuit and the signal forming circuit; the photoelectric sensing circuit is connected to the signal forming circuit, and is configured to perform photoelectric conversion on the incident light irradiation under the control of a first control signal so as to form a photoelectric voltage signal; the signal forming circuit is further connected to the signal conversion circuit, and is configured to transmit the photoelectric voltage signal to the signal conversion circuit under the control of a second control signal, and transmit a compensated photoelectric voltage signal to the signal conversion circuit; the signal output circuit is connected to the signal conversion circuit and the signal forming circuit, and is configured to transmit a second voltage to the signal conversion circuit and the signal forming circuit under the control of a third control signal, and output a photoelectric current signal; and the signal conversion circuit is configured to form the compensated photoelectric voltage signal according to the photoelectric voltage signal, and output the photoelectric current signal to the signal output circuit according to the compensated photoelectric voltage signal. The driving circuit can avoid the distortion problem of the captured image.

Referring to FIG. 1, an embodiment of the present disclosure provides a driving circuit for an active pixel sensor (APS), and the active pixel sensor can be used for an image sensor. The driving circuit comprises a reset circuit 1, a photoelectric sensing circuit 2, a signal forming circuit 3, a signal conversion circuit 4, and a signal output circuit 5.

The reset circuit 1 is connected to a first voltage terminal Vcom, a reset signal terminal Reset, the photoelectric sensing circuit 2, the signal forming circuit 3 and the signal conversion circuit 4 and configured for transmitting the first voltage of the first voltage terminal Vcom to the photoelectric sensing circuit 2 and the signal forming circuit 3 under the control of the reset signal of the reset signal terminal Reset so as to reset the photoelectric sensing circuit 2 and the signal forming circuit 3.

The photoelectric sensing circuit 2 is also connected to a ground terminal GND, a first control signal terminal Scan1, and the signal forming circuit 3 and configured for performing photoelectric conversion under the incident light irradiation and under the control of the first control signal of the first control signal terminal Scan1, for example, discharging to the ground terminal and forming the photoelectric voltage signal after discharging.

The signal forming circuit 3 is also connected to a second control signal terminal Scan2 and the signal conversion circuit 4 for transmitting the photoelectric voltage signal $V_1$ to the signal conversion circuit 4 under the control of the second control signal of the second control signal terminal Scan2.

The signal output circuit 5 is connected to a second voltage terminal Vdd, a third control signal terminal Scan3, and the signal conversion circuit 4 and configured for transmitting the second voltage $V_{dd}$ of the second voltage terminal Vdd to the signal conversion circuit 4 under the control of the third control signal of the third control signal terminal Scan3.

The signal forming circuit 3 compensates the photoelectric voltage signal $V_1$ with the cooperation of the signal conversion circuit 4, and transmits the compensated photoelectric voltage signal $V_2$ to the signal conversion circuit 4. The signal conversion circuit 4 is configured to form the compensated photoelectric voltage signal according to the photoelectric voltage signal $V_1$, and a gate voltage signal $V_2$ is obtained by the compensated photoelectric voltage signal, and the signal conversion circuit 4 forms the photoelectric current signal I under the control of the gate voltage signal $V_2$ and the second voltage $V_{dd}$. The photoelectric voltage signal $V_1$ forms the gate voltage signal $V_2=V_1-V_{th}$ through the signal conversion circuit 4, where $V_{th}$ is the voltage drop generated by the signal conversion circuit 4. The photoelectric current signal $I=K(V_{GS}-V_{th})^2$ formed by the signal conversion circuit 4, where $V_{GS}=V_{dd}-V_2$; and the photoelectric current signal I:

$$I=K(V_{dd}-V_2-V_{th})^2=K[V_{dd}-(V_1-V_{th})-V_{th}]^2=K(V_{dd}-V_1)^2.$$

Therefore, at this time, the photoelectric current signal I is not affected by the voltage drop $V_{th}$ of the signal conversion circuit 4, so the problem that the image taken by the image sensor of the active pixel circuit is distorted can be avoided.

In the embodiment, the signal output circuit 5 transmits the second voltage $V_{dd}$ to the signal conversion circuit 4 under the control of the third control signal Scan3. In this way, the signal conversion circuit 4 can be prevented from being always connected to the second voltage terminal Vdd, and the signal conversion circuit 4 is well protected.

The process of generating the photoelectric current signal I by the signal conversion circuit 4 needs to pass through four periods of time: a reset stage t1, an optical sensing accumulation stage t2, a discharging stage t3, and a signal acquisition stage t4. In the reset stage t1, the reset circuit 1 transmits the first voltage for resetting; in the optical sensing accumulation stage t2, the photoelectric sensing circuit 2 performs photoelectric conversion to form the photoelectric voltage signal; in the discharging stage t3, the signal forming circuit 3 transmits the photoelectric voltage signal $V_1$ to the signal conversion circuit 4, and the signal conversion circuit 4 forms the compensated photoelectric voltage signal; and in the signal acquisition stage t4, the signal output circuit 5 transmits the second voltage $V_{dd}$, and the signal conversion circuit 4 forms the photoelectric current signal I according to the compensated photoelectric voltage signal.

Figure 2:
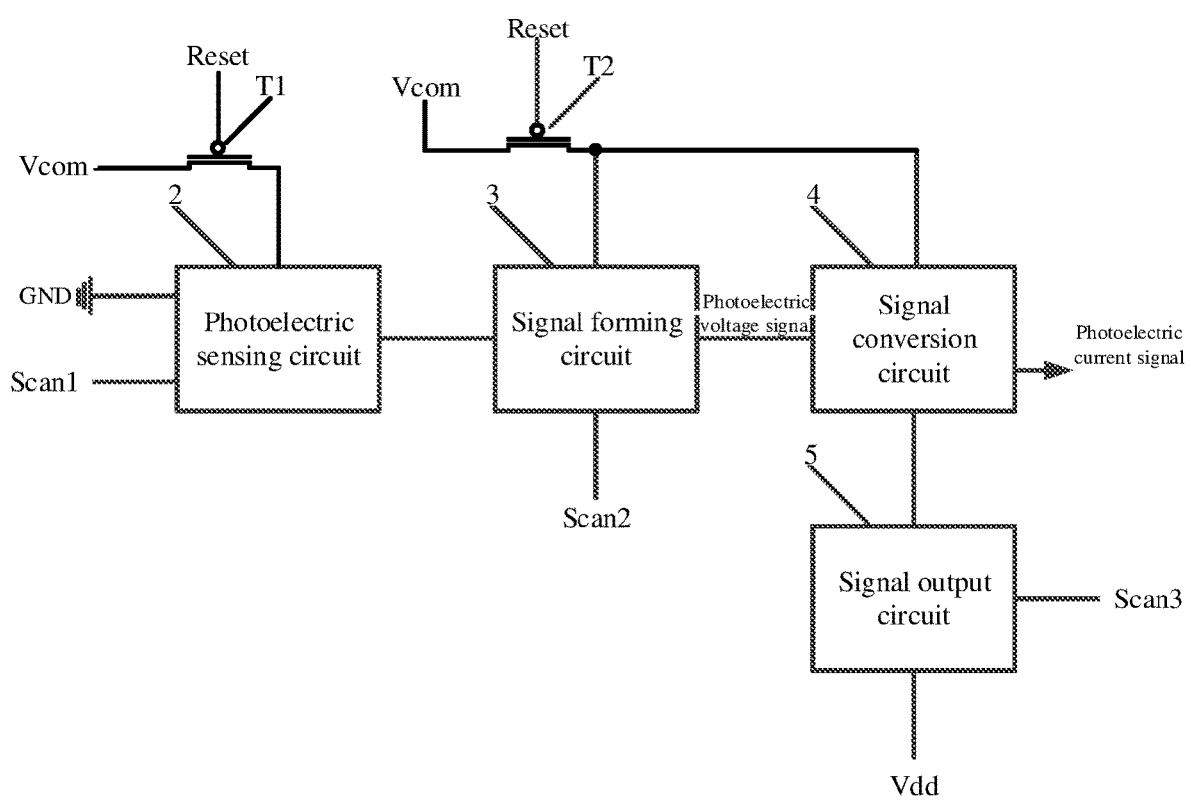
FIG. 2 is a schematic structural diagram of another driving circuit for an active pixel sensor provided by an embodiment of the present disclosure.

Optionally, referring to FIG. 2, in one example, the reset circuit 1 comprises a first transistor T1 and a second transistor T2. For the first transistor T1, a gate electrode is connected to the reset signal terminal Reset, and a first electrode is connected to the first voltage terminal Vcom, and a second electrode is connected to the photoelectric sensing circuit 2. For the second transistor T2, a gate electrode is connected to the reset signal terminal Reset, a first electrode is connected to the first voltage terminal Vcom, and a second electrode is connected to the signal forming circuit 3 and the signal conversion circuit 4. In another example, the first transistor T1 and the second transistor T2 may be combined to be the same transistor, that is, the second electrode of this transistor is connected to the photoelectric sensing circuit 2, the signal forming circuit 3, and the signal conversion circuit 4 at the same time.

In the example as shown in FIG. 2, in the reset stage t1, the first transistor T1 and the second transistor T2 are turned on under the control of the reset signal of the reset signal terminal Reset, and the first voltage of the first voltage terminal Vcom is transmitted to the photoelectric sensing circuit 2 through the first transistor T1, and is transmitted to the signal forming circuit 3 through the second transistor T2, thereby resetting the photoelectric sensing circuit 2 and the signal forming circuit 3.

Figure 3:
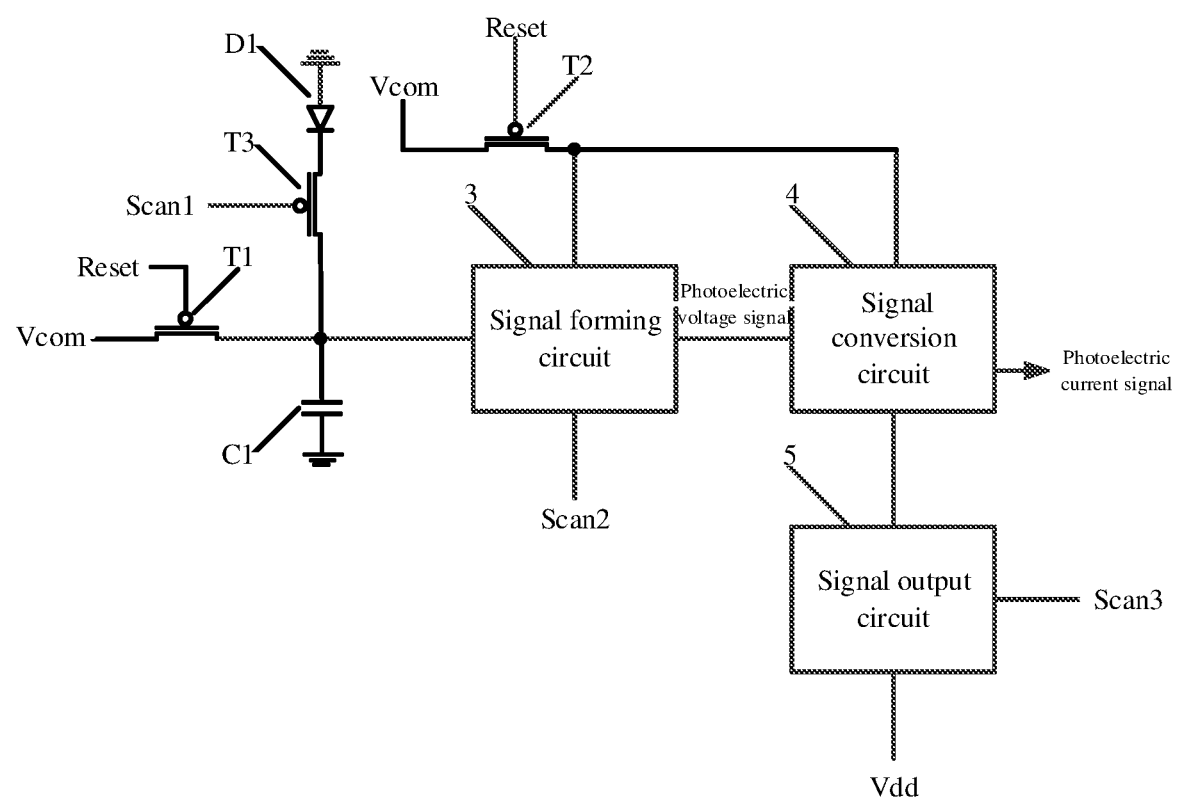
FIG. 3 is a schematic structural diagram of another driving circuit for an active pixel sensor provided by an embodiment of the present disclosure.

Optionally, referring to FIG. 3, in an example, the photoelectric sensing circuit 2 comprises a photodiode D1, a third transistor T3, and a first capacitor C1. An anode of the photodiode D1 is connected to the ground terminal, and a cathode of the photodiode D1 is connected to the third transistor T3.

A gate electrode of the third transistor T3 is connected to the first control signal terminal Scan1, and a second electrode of the third transistor T3 is connected to a first terminal of the first capacitor C1, the second electrode of the first transistor T1 and the signal forming circuit 3, and a second terminal of the first capacitor is grounded.

In the reset stage t1, the first capacitor C1 stores the first voltage of the first voltage terminal Vcom transmitted by the reset circuit. In the optical sensing accumulation stage t2, under the control of the first control signal of the first control signal terminal Scant, the third transistor T3 turns on to electrically connect the photodiode D1 and the first capacitor C1, and the photodiode D1 performs photoelectric conversion under the incident light irradiation and becomes reversely conducting, at this time, the first capacitor C1 discharges to the ground terminal, and the voltage signal stored by the first capacitor C1 is the photoelectric voltage signal $V_1$ at the end of the optical sensing accumulation stage t2.

Figure 4:
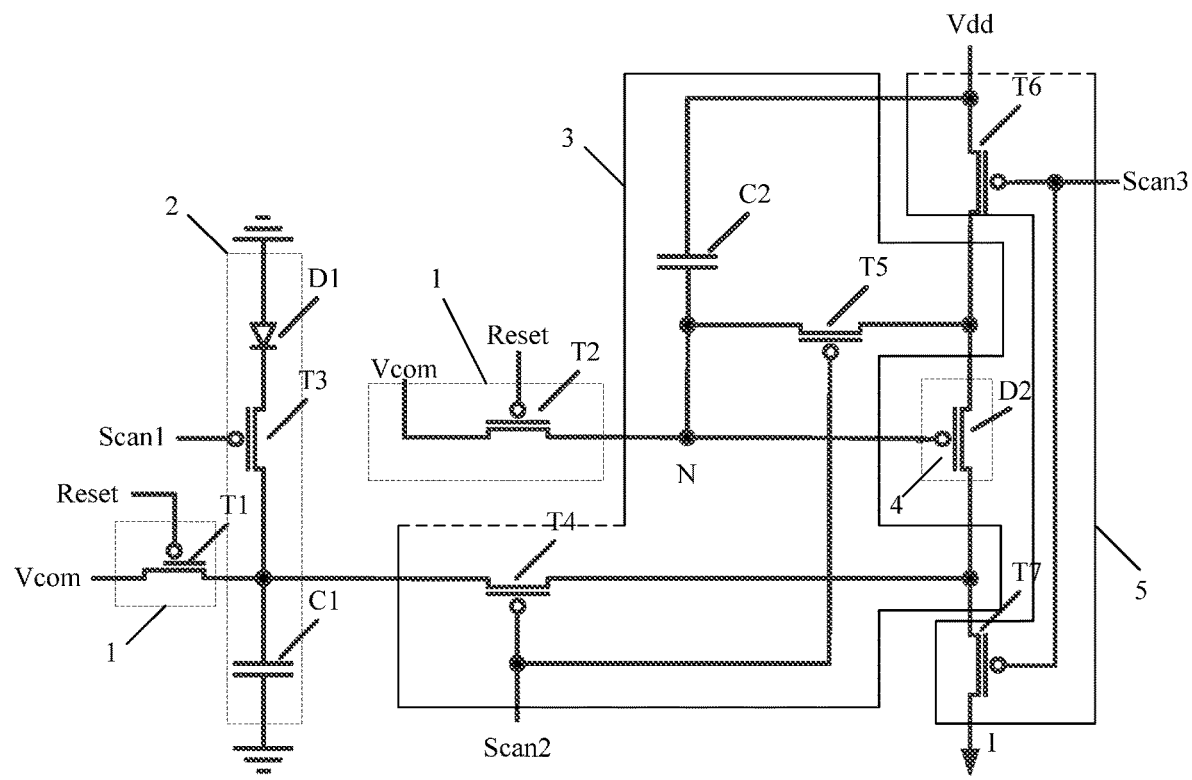
FIG. 4 is a schematic structural diagram of another driving circuit for an active pixel sensor provided by an embodiment of the present disclosure.

Optionally, referring to FIG. 4, in an example, the signal forming circuit 3 comprises a second capacitor C2, a fourth transistor T4, and a fifth transistor T5. For the fourth transistor T4, a first electrode is connected to the first terminal of the first capacitor C1, a second electrode is connected to the signal conversion circuit 4, and a gate electrode is connected to the second control signal terminal Scan2. For the fifth transistor T5, a first electrode is connected to the signal conversion circuit 4, a second electrode is connected to a first terminal of the second capacitor C2, and a gate electrode is connected to the second control signal terminal Scan2; and a second terminal of the second capacitor C2 is connected to the second voltage terminal Vdd.

Optionally, in one example, the signal conversion circuit 4 comprises a driving transistor D2, and a gate electrode of the driving transistor D2 is connected to the first terminal of the second capacitor C2, the second electrode of the fifth transistor T5 and the second electrode of the second transistor T2; a source electrode of the driving transistor D2 is connected to the signal output circuit 5 and the first electrode of the fifth transistor T5; and a drain electrode of the driving transistor D2 is connected to the signal output circuit 5 and the second electrode of the fourth transistor T4. At this time, there is a voltage drop $V_{th}$ between the source electrode and the drain electrode of the driving transistor D2, and the voltage between the gate electrode and the source electrode is $V_{GS}$. $V_{th}$ is also the threshold voltage of the driving transistor D2.

In the example as shown in FIG. 4, the reset circuit 1, the photoelectric sensing circuit 2, the signal forming circuit 3, the signal conversion circuit 4, and the signal output circuit 5 are indicated by dotted boxes.

In the discharging stage t3, the fourth transistor T4 and the fifth transistor T5 are turned on under the control of the second control signal of the second control signal terminal Scan2; the photoelectric voltage signal $V_1$ in the first capacitor C1 is transmitted through the fourth transistor T4 to the drain electrode of the driving transistor D2; the driving transistor D2 outputs the gate voltage signal $V_2$ from the source electrode, $V_2=V_1-V_{th}$, the gate voltage signal $V_2$ is the compensated photoelectric voltage signal and is transmitted to the second capacitor C2 through the fifth transistor T5 for to be stored in the second capacitor C2.

Optionally, still referring to FIG. 4, in one example, the signal output circuit 5 comprises a sixth transistor T6 and a seventh transistor T7. For the sixth transistor T6, a gate electrode is connected to the third control signal terminal Scan3, a first electrode is connected to the second voltage terminal Vdd, and a second electrode is connected to the source electrode of the driving transistor D2. For the seventh transistor T7, a gate electrode is connected to the third control signal terminal Scan3, a first electrode is connected to the drain electrode of the driving transistor D2, and a second electrode is connected to the output terminal of the signal conversion circuit. The second electrode of the seventh transistor T7 is used to output the photoelectric current signal I generated by the signal conversion circuit. The second electrode of the seventh transistor T7 is electrically connected to, for example, a signal processing circuit.

In the signal acquisition stage t4, the sixth transistor T6 and the seventh transistor T7 are all turned on under the control of the third control signal of the third control signal terminal Scan3, and the second voltage $V_{dd}$ of the second voltage terminal Vdd is transmitted to the source electrode of the driving transistor D2 through the sixth transistor T6; the gate voltage signal $V_2$ stored in the second capacitor C2 is transmitted to the gate electrode of the driving transistor D2, and the driving transistor D2 is turned on and operates in the saturation state under the control of the gate voltage signal V2 stored in the second capacitor C2, thus, the driving transistor D2 can output the photoelectric current signal I from the drain electrode and in turn output through the seventh transistor T7.

In at least one example of the present disclosure, the reset circuit, the photoelectric sensing circuit, the signal forming circuit, the signal conversion circuit, and the signal output circuit may all use P-type transistors. For example, the first transistor T1, the second transistor T2, the third transistor T3, the fourth transistor T4, the fifth transistor T5, the sixth transistor T6, the seventh transistor T7, and the driving transistor D2 are all P-type transistors.

It should be noted that the transistors used in at least one embodiment of the present disclosure may all be thin film transistors or field effect transistors or other switching devices with the same characteristics. The source electrode and the drain electrode of the transistor used herein may be symmetrical in structure, so the source electrode and the drain electrode may not be structurally different. In order to distinguish the two electrodes except the gate electrode of the transistor, one of the electrodes is directly referred to as a source electrode and the other is referred to a drain electrode, so the source electrodes and the drain electrodes of all or some of the transistors in the embodiment of the present disclosure are interchangeable as desired. In addition, the transistors may be classified into N-type transistors and P-type transistors according to the characteristics of the transistors, and the embodiments of the present disclosure are all described by using P-type transistors as examples. Based on the description and teaching of the implementation manner of the P-type transistor in the embodiment of the disclosure, those skilled in the art can easily think of the implementation manner of the embodiment of the present disclosure using an N-type transistor without creative efforts, and therefore these implementations manner are also within the scope of the present disclosure as well.

Figure 5:
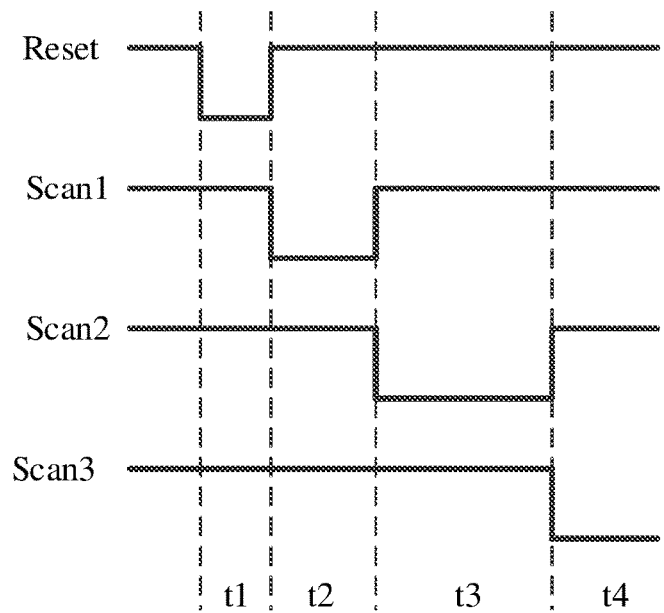
FIG. 5 is a schematic diagram of a timing signal provided by an embodiment of the present disclosure.

FIG. 5 is a timing signal diagram of the reset signal and each control signal in the reset stage t1, the optical sensing accumulation stage t2, the discharging stage t3, and the signal acquisition stage t4, respectively. The signal conversion circuit generates the photoelectric current signal I, and the detailed working processes of the active pixel sensor in the reset stage t1, the optical sensing accumulation stage t2, the discharging stage t3, and the signal acquisition stage t4 are as follows.

Figure 6:
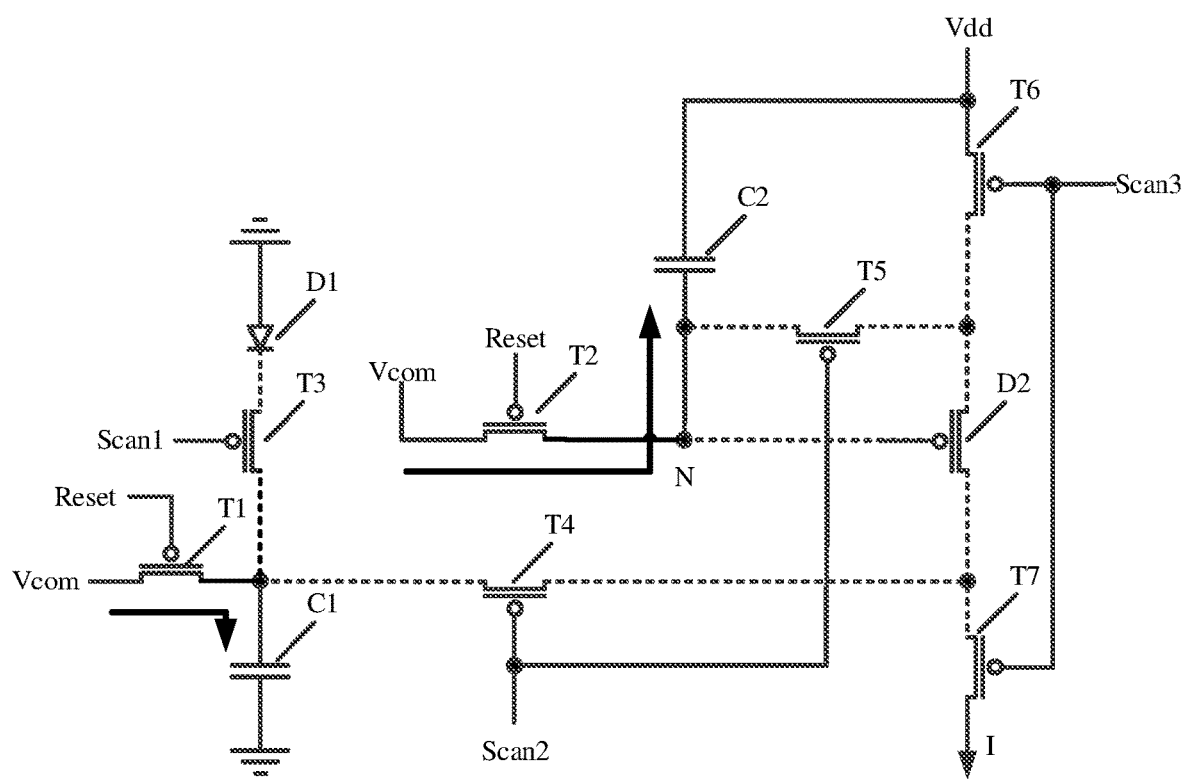
FIG. 6 is a schematic diagram of signal transmission in a reset stage provided by an embodiment of the present disclosure.

In the reset stage t1, referring to FIG. 6, the reset terminal Reset outputs a low level reset signal, and the first transistor T1 and the second transistor T2 are turned on under the control of the reset signal, thereby resetting the photoelectric sensing circuit 2 and the signal forming circuit 3. Specifically, both the first capacitor C1 and the second capacitor C2 are in electrical communication with the first voltage terminal Vcom, and the first voltage terminal Vcom transmits the first voltage $V_0$ to the first capacitor C1 and the second capacitor C2, and the first capacitor C1 and the second capacitor C2 store the first voltage $V_0$. In addition, the voltage signal of the control point N is also set to the first voltage $V_0$.

In addition, in the reset stage t1, the first control signal terminal Scan1 outputs a high level first control signal, and the third transistor T3 is turned off under the control of the first control signal; the second control signal terminal Scan2 outputs a high level second control signal, and the fourth transistor T4 and the fifth transistor T5 are turned off under the control of the second control signal; and the third control signal terminal Scan3 outputs a high level third control signal, the sixth transistor T6 and the seventh transistor T7 are turned off under the control of the third control signal. The dashed line in FIG. 6 indicates the unconnected circuit portion, and the solid line indicates the connected circuit portion, which will be adopted in a similar way without explanation again.

Figure 7:
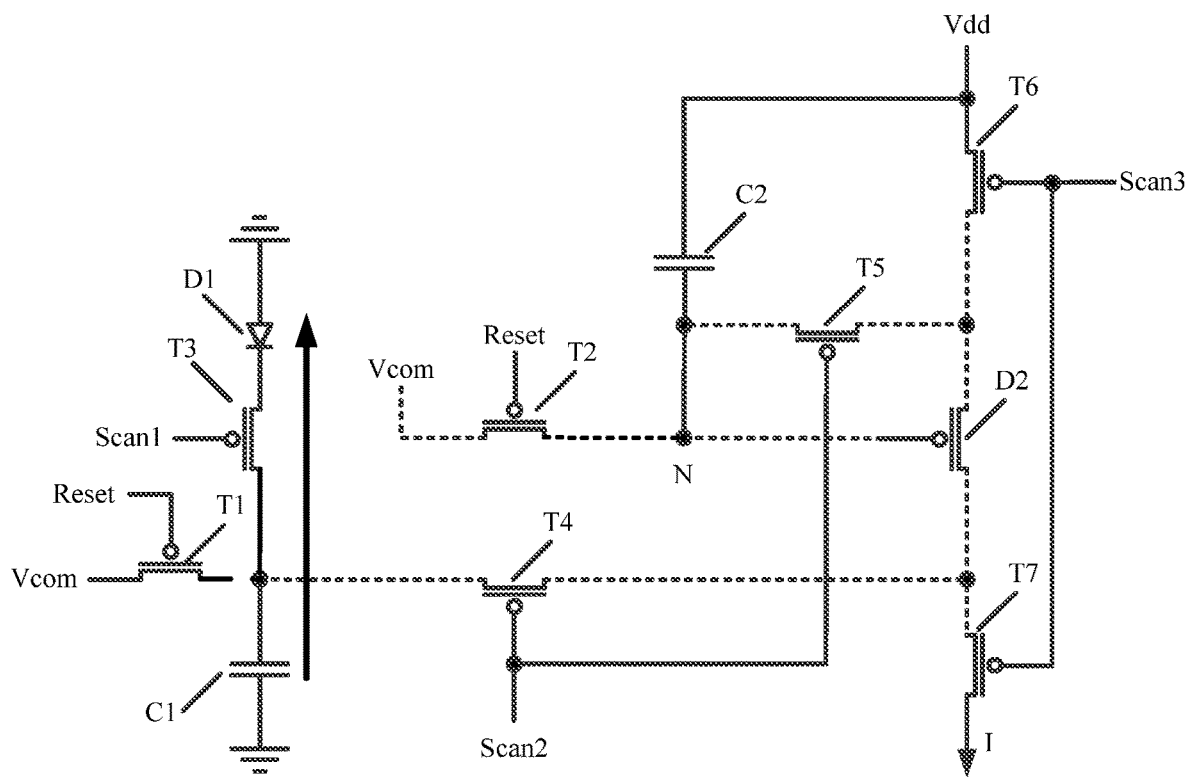
FIG. 7 is a schematic diagram of signal transmission in an optical sensing accumulation stage provided by an embodiment of the present disclosure.

In the optical sensing accumulation stage t2, referring to FIG. 7, the reset signal terminal Reset outputs a high level reset signal, and the first transistor T1 and the second transistor T2 are turned off under the control of the reset signal. The first control signal terminal Scan1 outputs a low level first control signal, the third transistor T3 is turned on under the control of the first control signal, and the photodiode D1 and the first capacitor C1 are turned on; the photodiode D1 reversely conducts under the incident light irradiation due to the photoelectric conversion, so that the first capacitor C1 discharges to the ground; and the voltage signal stored by the first capacitor C1 is the photoelectric voltage signal $V_1$ at the end of the optical sensing accumulation stage t2.

In addition, in the optical sensing accumulation stage t2, the second control signal terminal Scan2 outputs a high level second control signal, and the fourth transistor T4 and the fifth transistor T5 are turned off under the control of the second control signal; and the third control signal terminal Scan3 outputs a high level third control signal, the sixth transistor T6 and the seventh transistor T7 are turned off under the control of the third control signal Sscan3.

It should be noted that the degree of reverse conduction of the photodiode D1 is different under the incident light irradiation of different intensity, so the degree of the first capacitor C1 discharging to the ground terminal is also different in the discharging stage t2; and the magnitude of the voltage signal which is the photoelectric voltage signal $V_1$ stored by the first capacitor C1 is also different at the end of the discharging stage t2.

Figure 8:
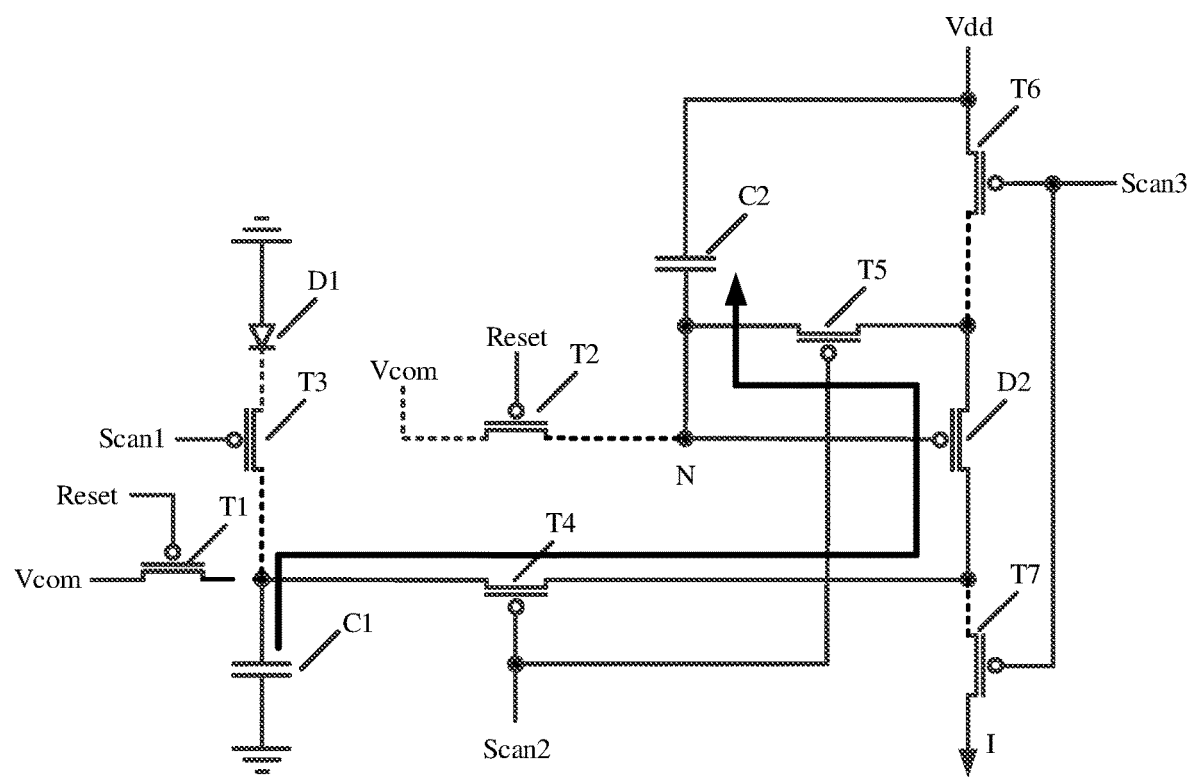
FIG. 8 is a schematic diagram of signal transmission in a discharging stage provided by an embodiment of the present disclosure.

In the discharging stage t3, referring to FIG. 8, the reset signal terminal Reset outputs a high level reset signal, and the first transistor T1 and the second transistor T2 are turned off under the control of the reset signal. The first control signal terminal Scan1 outputs a high level first control signal, and the third transistor T3 is turned off under the control of the first control signal.

The second control signal terminal Scan2 outputs a low level second control signal, and the fourth transistor T4 and the fifth transistor T5 are turned on under the control of the second control signal. Because the second capacitor C2 outputs the first voltage $V_0$ to the gate electrode of the driving transistor D2 and this first voltage $V_0$ is a low voltage signal, the driving transistor D2 is also turned on under the control of the first voltage $V_0$. In this way, the photoelectric voltage signal $V_1$ of the first capacitor C1 is transmitted to the drain electrode of the driving transistor D2 through the fourth transistor T4, and the driving transistor D2 outputs the gate voltage signal $V_2$ from the source electrode thereof, and the gate voltage signal $V_2$ charges the second capacitor C2 through the fifth transistor T5, and charges the voltage of the second capacitor C2 to be equal to the voltage of the gate voltage signal $V_2$, and the gate voltage signal $V_2 = V_1 - V_{th}$, thus, the second capacitor C2 stores the gate voltage signal $V_2$.

In addition, in the discharging stage t3, the third control signal terminal Scan3 outputs a high level third control signal, and the sixth transistor T6 and the seventh transistor T7 are turned off under the control of the third control signal.

Figure 9:
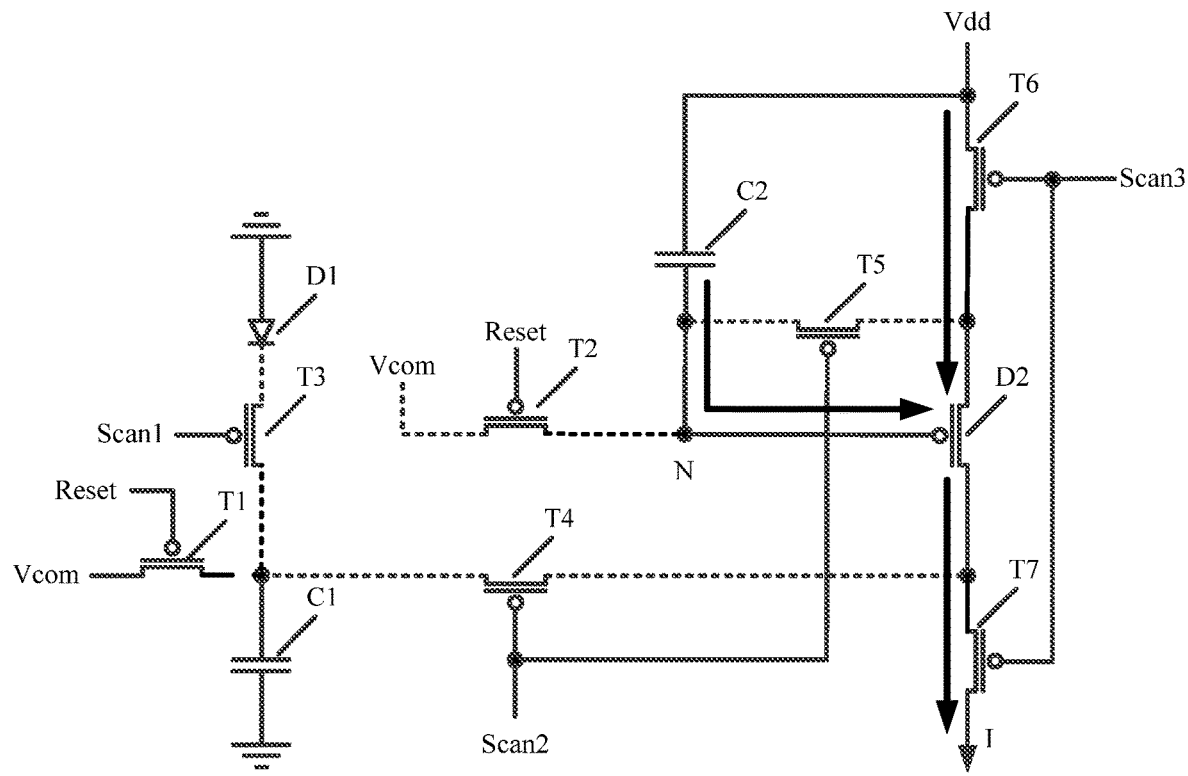
FIG. 9 is a schematic diagram of signal transmission in a signal acquisition stage provided by an embodiment of the present disclosure.

In the signal acquisition stage t4, referring to FIG. 9, the reset signal terminal Reset outputs a high level reset signal, and the first transistor T1 and the second transistor T2 are turned off under the control of the reset signal. The first control signal terminal Scan1 outputs a high level first control signal, and the third transistor T3 is turned off under the control of the first control signal. The second control signal terminal Scan2 outputs a high level second control signal, and the fourth transistor T4 and the fifth transistor T5 are turned off under the control of the second control signal.

The third control signal terminal Scan3 outputs a low level third control signal, and the sixth transistor T6 and the seventh transistor T7 are turned on under the control of the third control signal; the second voltage $V_{dd}$ output by the second voltage terminal Vdd is transmitted to the source electrode of the driving transistor D2 through the sixth transistor T6; and the gate voltage signal $V_2$ stored by the second capacitor C2 is transmitted to the gate electrode of the driving transistor D2, so the driving transistor D2 is turned on and operates in the saturated state, and the driving transistor D2 outputs the following photoelectric current signal I from the drain electrode:

$$I = K(V_{GS} - V_{th})^2 = K(V_{dd} - V_2 - V_{th})^2 = K[V_{dd} - (V_1 - V_{th}) - V_{th}]^2 = K(V_{dd} - V_1)^2,$$

the photoelectric current signal I is output through the seventh transistor T7.

In the embodiment of the present disclosure, because the signal forming circuit transmits the photoelectric voltage signal $V_1$ to the signal conversion circuit, and the signal conversion circuit forms the compensated gate voltage signal $V_2 = V_1 - V_{th}$, and the second voltage terminal transmits the second voltage $V_{dd}$ to the signal conversion circuit so that the signal conversion circuit forms the following photoelectric current signal I:

$$I = K(V_{GS} - V_{th})^2 = K[V_{dd} - (V_1 - V_{th}) - V_{th}]^2 = K(V_{dd} - V_1)^2.$$

Therefore, the photoelectric current signal formed by the signal conversion circuit under the control of the compensated gate voltage signal $V_2$ is not affected by the voltage drop $V_{th}$ of the signal conversion circuit any more, and the distortion problem of an image captured by the image sensor of the active pixel sensor in the above embodiment is avoided.

An embodiment of the present disclosure also provides an active pixel sensor comprising the driver circuit provided by any one of the embodiments of the present disclosure.

As shown in FIG. 10, an embodiment of the present disclosure also provides an image sensor comprising a plurality of pixel units arranged in an array, and at least one pixel unit comprises the active pixel sensor provided by any one of the embodiments of the present disclosure. The image sensor comprises, for example, an array of pixel units of X rows and Y columns, and X row lines (selection signal lines Em) and Y column lines (readout lines RL) are formed correspondingly.

The image sensor may further comprise peripheral circuits such as a row driving circuit, a column driving circuit, an amplifying circuit, and a preprocessing circuit in addition to the pixel unit array. The pixel unit array and the peripheral circuits may be formed on a silicon substrate, a glass substrate, a quartz substrate, etc., for example, by the semiconductor integrated circuit fabrication process (for example, CMOS integrated circuit fabrication process). For example, the silicon substrate may be, for example, a single crystal silicon substrate, a silicon-on-insulator (SOI) substrate, or the like.

An embodiment of the present disclosure also provides an electronic device comprising the image sensor provided by any one of the embodiments of the present disclosure. For example, the electronic device may be a digital camera, a mobile phone, a tablet, a laptop, a watch, glasses, a camera, and the like.

In the embodiment of the present disclosure, because the active pixel sensor comprises the driving circuit provided by the first embodiment, moreover, because in the driving circuit, the signal forming circuit passes the photoelectric voltage signal $V_1$ through the signal conversion circuit to form the compensated gate voltage signal $V_2 = V_1 - V_{th}$, the second voltage terminal inputs the second voltage $V_{dd}$ to the signal conversion circuit, so that the signal conversion circuit forms the photoelectric current signal I:

$$I = K(V_{GS} - V_{th})^2 = K[V_{dd} - (V_1 - V_{th}) - V_{th}]^2 = K(V_{dd} - V_1)^2.$$

Therefore, the photoelectric current signal formed by the signal conversion circuit under the control of the compensated gate voltage signal $V_2$ is not affected by the voltage drop $V_{th}$ of the signal conversion circuit.

Referring to FIG. 11, an embodiment of the present disclosure further provides a driving method for the active pixel sensor. The driving method comprises the reset stage, the optical sensing accumulation stage, the discharging stage, and the signal acquisition stage.

Step 201: in the reset stage, the reset signal terminal outputs the reset signal, and the first voltage of the first voltage terminal is transmitted to the signal forming circuit and the photoelectric sensing circuit under the control of the reset signal.

Step 202: in the optical sensing accumulation stage, the photoelectric sensing circuit performs photoelectric conversion under the incident light irradiation to form the photoelectric voltage signal.

Step 203: in the discharging stage, the signal forming circuit transmits the photoelectric voltage signal to the signal conversion circuit, and the signal conversion circuit converts the photoelectric voltage signal into the compensated photoelectric voltage signal.

Step 204: in the signal acquisition stage, the signal output circuit outputs the second voltage to the signal conversion circuit, and the signal conversion circuit outputs the photoelectric current signal to the signal output circuit according to the compensated photoelectric voltage signal.

Optionally, in an example, the above step 201 may further comprise: under the control of the reset signal of the reset signal terminal, the first transistor and the second transistor are turned on, and the first voltage of the first voltage terminal is transmitted to the first capacitor through the first transistor and is transmitted to the second capacitor through the second transistor.

Optionally, in one example, the above step 202 may further comprise the following sub-steps:

Sub-step 2021: the photodiode and the first capacitor are turned on by the third transistor under the control of the first control signal of the first control signal terminal.

Sub-step 2022: the first capacitor and the ground terminal are turned on by the photodiode under the incident light irradiation, and the first capacitor discharges to the ground terminal and forms the photoelectric voltage signal after discharging.

Optionally, in one example, the above step 203 may further comprise the following sub-steps:

Sub-step 2031: the fourth transistor and the fifth transistor are turned on under the control of the second control signal of the second control signal terminal.

Sub-step 2032: the photoelectric voltage signal of the first capacitor is transmitted to the drain electrode of the driving transistor through the fourth transistor, and transmitted from the source electrode of the driving transistor to form the gate voltage signal.

Sub-step 2033: the gate voltage signal is transmitted to the second capacitor through the fifth transistor.

Optionally, in one example, the above step 204 may further comprise the following sub-steps:

Sub-step 2041: the sixth transistor and the seventh transistor are turned on under the control of the third control signal of the third control signal terminal.

Sub-step 2042: the second voltage of the second voltage terminal is transmitted to the source electrode of the driving transistor through the sixth transistor, and the gate voltage signal of the second capacitor is transmitted to the gate electrode of the driving transistor.

Sub-step 2043: the drain electrode of the drive transistor outputs the photoelectric current signal, and the photoelectric current signal output through the seventh transistor.

In at least one embodiment of the present disclosure, the photoelectric voltage signal is transmitted to the signal conversion circuit through the signal forming circuit, and the signal conversion circuit obtains the compensated photoelectric voltage signal according to the photoelectric voltage signal, such that the signal conversion circuit forms the photoelectric current signal under the control of the compensated photoelectric voltage signal and the second voltage. Because the compensated photoelectric voltage signal is obtained through the signal forming circuit and the signal conversion circuit, the compensated photoelectric voltage signal eliminates the voltage drop of the signal conversion circuit on the basis of the photoelectric voltage signal, the photoelectric current signal formed by the compensated photoelectric voltage signal is not affected by the voltage drop of the signal conversion circuit, and the distortion problem of the image captured by the image sensor of the active pixel sensor of the above embodiment is avoided.

What are described above is related to the illustrative embodiments of the disclosure only and not limitative to the scope of the disclosure; the scopes of the disclosure are defined by the accompanying claims.

The application claims priority to the Chinese patent application No. 201610937403.8, filed Nov. 1, 2016, the entire disclosure of which is incorporated herein by reference as part of the present application.

What is claimed is:

1. A driving circuit for an active pixel sensor, comprising: a reset circuit, a photoelectric sensing circuit, a signal forming circuit, a signal conversion circuit, and a signal output circuit, wherein:

the reset circuit is connected to the photoelectric sensing circuit, the signal forming circuit, and the signal conversion circuit, and is configured to transmit a first voltage, under control of a reset signal, to the photoelectric sensing circuit and the signal forming circuit so as to reset the photoelectric sensing circuit and the signal forming circuit;

the photoelectric sensing circuit is connected to the signal forming circuit, and is configured to perform photoelectric conversion on incident light irradiation under control of a first control signal so as to form a photoelectric voltage signal;

the signal forming circuit is further connected to the signal conversion circuit, and is configured to transmit the photoelectric voltage signal to the signal conversion circuit under control of a second control signal, and transmit a compensated photoelectric voltage signal to the signal conversion circuit;

the signal output circuit is connected to the signal conversion circuit and the signal forming circuit, and is configured to transmit a second voltage, under control of a third control signal, to the signal conversion circuit and the signal forming circuit, and output a photoelectric current signal; and the signal conversion circuit is configured to form the compensated photoelectric voltage signal according to the photoelectric voltage signal, and output the photoelectric current signal to the signal output circuit according to the compensated photoelectric voltage signal.

2. The driving circuit according to claim 1, wherein the reset circuit is further connected to a first voltage terminal and a reset signal terminal to receive the reset signal and the first voltage;

the photoelectric sensing circuit is further connected to a ground terminal and a first control signal terminal to connect to the ground and receive the first control signal;
the signal forming circuit is also connected to a second control signal terminal to receive the second control signal; and
the signal output circuit is also connected to a second voltage terminal and a third control signal terminal to receive the second voltage and the third control signal.

3. The driving circuit according to claim 2, wherein the signal forming circuit comprises a second capacitor, a fourth transistor, and a fifth transistor;

wherein a first electrode of the fourth transistor is connected to a first terminal of a first capacitor, a second electrode of the fourth transistor is connected to the signal conversion circuit, and a gate electrode of the fourth transistor receives the second control signal;
a first electrode of the fifth transistor is connected to the signal conversion circuit, a second electrode of the fifth transistor is connected to a first terminal of the second capacitor, and a gate electrode of the fifth transistor receives the second control signal; and
a second terminal of the second capacitor receives the second voltage.

4. The driving circuit according to claim 3, wherein the reset circuit comprises a first transistor and a second transistor;

wherein a gate electrode of the first transistor receives the reset signal, a first electrode of the first transistor receives the first voltage, and a second electrode of the first transistor is connected to the photoelectric sensing circuit; and
a gate electrode of the second transistor receives the reset signal, a first electrode of the second transistor receives the first voltage, and a second electrode of the second transistor is connected to the signal forming circuit and the signal conversion circuit.

5. The driving circuit according to claim 4, wherein the photoelectric sensing circuit comprises a photodiode, a third transistor and a first capacitor, wherein an anode of the photodiode is grounded, and a cathode of the photodiode is connected to a first electrode of the third transistor; and
a gate electrode of the third transistor receives the first control signal, a second electrode of the third transistor is connected to a first terminal of the first capacitor, the second electrode of the first transistor, and the signal forming circuit, and a second terminal of the first capacitor is grounded.

6. The driving circuit according to claim 5, wherein the signal conversion circuit comprises a driving transistor, wherein, a gate electrode of the driving transistor is connected to the first terminal of the second capacitor, the second electrode of the fifth transistor, and the second electrode of the second transistor;
a source electrode of the driving transistor is connected to the signal output circuit and the first electrode of the fifth transistor; and
a drain electrode of the driving transistor is connected to the signal output circuit and the second electrode of the fourth transistor.

7. The driving circuit according to claim 6, wherein the signal output circuit comprises a sixth transistor and a seventh transistor, wherein a gate electrode of the sixth transistor receives the third control signal, a first electrode of the sixth transistor receives the second voltage, and a second electrode of the sixth transistor is connected to the source electrode of the driving transistor; and
a gate electrode of the seventh transistor receives the third control signal, a first electrode of the seventh transistor is connected to the drain electrode of the driving transistor, and a second electrode of the seventh transistor is connected to an output of the signal conversion circuit.

8. The driving circuit according to claim 7, wherein the reset circuit, the photoelectric sensing circuit, the signal forming circuit, the signal conversion circuit, and the signal output circuit are all formed by P-type transistors.

9. The driving circuit according to claim 1, wherein the reset circuit, the photoelectric sensing circuit, the signal forming circuit, the signal conversion circuit, and the signal output circuit are all formed by P-type transistors.

10. An active pixel sensor, wherein the active pixel sensor comprises the driving circuit according to claim 1.

11. An image sensor, comprising a plurality of pixel units arranged in an array, and at least one pixel unit comprising the active pixel sensor according to claim 10.

12. An electronic device, comprising the image sensor according to claim 11.

13. A driving method for a driving circuit of an active pixel sensor according to claim 1, comprising a reset stage, an optical sensing accumulation stage, a discharging stage, and a signal acquisition stage, wherein in the reset stage, the reset circuit transmits the first voltage to the signal forming circuit and the photoelectric sensing circuit to reset the photoelectric sensing circuit and the signal forming circuit;
in the optical sensing accumulation stage, the photoelectric sensing circuit performs photoelectric conversion on the incident light irradiation to form the photoelectric voltage signal;
in the discharging stage, the signal forming circuit transmits the photoelectric voltage signal to the signal conversion circuit, and the signal conversion circuit converts the photoelectric voltage signal into the compensated photoelectric voltage signal; and
in the signal acquisition stage, the signal output circuit outputs the second voltage to the signal conversion circuit, and the signal conversion circuit outputs the photoelectric current signal to the signal output circuit according to the compensated photoelectric voltage signal.

14. The driving method according to claim 13, wherein in the reset stage, the reset signal is provided, and the first voltage of the first voltage terminal is transmitted, under control of the reset signal, to the signal forming circuit and the photoelectric sensing circuit so as to reset the photoelectric sensing circuit and the signal forming circuit;

in the optical sensing accumulation stage, the first control signal is provided, and the photoelectric sensing circuit performs photoelectric conversion under the incident light irradiation and under control of the first control signal so as to form the photoelectric voltage signal;
in the discharging stage, the second control signal is provided, and the signal forming circuit transmits the photoelectric voltage signal to the signal conversion circuit under control of the second control signal, and the signal conversion circuit converts the photoelectric voltage signal into the compensated photoelectric voltage signal; and in the signal acquisition stage, the third control signal is provided, and the signal output circuit outputs the second voltage to the signal conversion circuit under control of the third control signal, and the signal conversion circuit outputs the photoelectric current signal to the signal output circuit according to the compensated photoelectric voltage signal.

15. The driving method according to claim 14, wherein operation that the signal forming circuit transmits the photoelectric voltage signal to the signal conversion circuit under control of the second control signal, and the signal conversion circuit converts the photoelectric voltage signal into the compensated photoelectric voltage signal, comprises:

a fourth transistor and a fifth transistor are turned on under control of the second control signal;

the photoelectric voltage signal of a first capacitor is transmitted to a drain electrode of a driving transistor through the fourth transistor, and transmitted from a source electrode of the driving transistor to form a gate voltage signal; and the gate voltage signal is transmitted to a second capacitor through the fifth transistor.

16. The driving method according to claim 14, wherein operation that the first voltage of the first voltage terminal is transmitted, under control of the reset signal, to the signal forming circuit and the photoelectric sensing circuit so as to reset the photoelectric sensing circuit and the signal forming circuit, comprises:

a first transistor and a second transistor are turned on, the first voltage is transmitted to the first capacitor through the first transistor, and is transmitted to the second capacitor through the second transistor under control of the reset signal.

17. The driving method according to claim 14, wherein operation that the photoelectric sensing circuit performs photoelectric conversion to form the photoelectric voltage signal under the incident light irradiation and under control of the first control signal, comprises:

a third transistor turns on a photodiode and the first capacitor under control of the first control signal; and the photodiode turns on the first capacitor and the ground terminal under the incident light irradiation, and the first capacitor discharges to the ground terminal, and forms a photoelectric voltage signal after discharging.

18. The driving method according to claim 14, wherein operation that the signal output circuit outputs the second voltage to the signal conversion circuit under control of the third control signal, and the signal conversion circuit outputs the photoelectric current signal to the signal output circuit according to the compensated photoelectric voltage signal, comprises:

a sixth transistor and a seventh transistor are turned on under control of the third control signal;

the second voltage is transmitted to the source electrode of the driving transistor through the sixth transistor, and the gate voltage signal of the second capacitor is transmitted to the gate electrode of the driving transistor; and the drain electrode of the driving transistor outputs the photoelectric current signal, and the photoelectric current signal is output through the seventh transistor.

\* \* \* \* \*